(12) United States Patent
Fossum

(10) Patent No.: US 6,667,768 B1
(45) Date of Patent: Dec. 23, 2003

(54) PHOTODIODE-TYPE PIXEL FOR GLOBAL ELECTRONIC SHUTTER AND REDUCED LAG

(75) Inventor: Eric R. Fossum, La Crescenta, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/025,079

(22) Filed: Feb. 17, 1998

(51) Int. Cl.[7] ............................ H04N 3/14; H04N 5/335
(52) U.S. Cl. ........................................ 348/308; 348/313
(58) Field of Search ................................ 348/308, 309, 348/301, 302, 303, 313, 314, 362, 296, 297; 257/292, 291, 237, 239, 216; 250/208.1

(56) References Cited

U.S. PATENT DOCUMENTS

| | | | |
|---|---|---|---|
| 4,369,378 A | * 1/1983 | Rockett, Jr. | 257/237 |
| 4,644,572 A | * 2/1987 | Lambeth | 257/216 |
| 4,684,800 A | * 8/1987 | Morse et al. | 257/237 |
| 4,686,648 A | 8/1987 | Fossum | |
| 4,744,623 A | 5/1988 | Prucnal et al. | |
| 4,776,925 A | 10/1988 | Fossum et al. | |
| 4,839,735 A | * 6/1989 | Kyomasu et al. | 348/297 |
| 4,920,069 A | 4/1990 | Fossum et al. | |
| 5,054,040 A | * 10/1991 | Yariv et al. | 257/237 |
| 5,055,900 A | 10/1991 | Fossum et al. | |
| 5,080,214 A | 1/1992 | Fossum | |
| 5,105,277 A | * 4/1992 | Hayes et al. | 348/313 |
| 5,236,871 A | 8/1993 | Fossum et al. | |
| 5,343,297 A | * 8/1994 | Tiemann et al. | 348/306 |
| 5,386,128 A | 1/1995 | Fossum et al. | |
| 5,471,515 A | 11/1995 | Fossum et al. | |
| 5,548,773 A | 8/1996 | Kemeny et al. | |
| 5,665,959 A | 9/1997 | Fossum et al. | |
| 5,793,322 A | 8/1998 | Fossum et al. | |
| 5,841,126 A | 11/1998 | Fossum et al. | |
| 5,872,371 A | * 2/1999 | Guidash et al. | 257/292 |
| 5,880,691 A | 3/1999 | Fossum et al. | |
| 5,886,659 A | 3/1999 | Pain et al. | |
| 5,887,049 A | 3/1999 | Fossum | |
| 5,909,026 A | 6/1999 | Zhou et al. | |
| 5,920,345 A | * 7/1999 | Sauer | 348/308 |
| 5,949,483 A | 9/1999 | Fossum et al. | |
| 5,952,645 A | 9/1999 | Wang et al. | |
| 5,990,506 A | 11/1999 | Fossum et al. | |
| 5,995,163 A | 11/1999 | Fossum | |
| 6,005,619 A | 12/1999 | Fossum | |
| 6,008,486 A | 12/1999 | Stam et al. | |
| 6,021,172 A | 2/2000 | Fossum et al. | |
| 6,057,539 A | 5/2000 | Zhou et al. | |
| 6,137,100 A | * 10/2000 | Fossum et al. | 250/208.1 |
| 6,166,768 A | * 12/2000 | Fossum et al. | 348/308 |
| 6,201,270 B1 | * 3/2001 | Chen | 257/292 |

* cited by examiner

*Primary Examiner*—Aung S. Moe
(74) *Attorney, Agent, or Firm*—Dickstein Shapiro Morin & Oshinsky LLP

(57) ABSTRACT

Operation for global electronic shutter photodiode-type pixels. In a first mode of operation, lag is reduced through global reset of the photodiode array and fixed pattern noise is eliminated through comparison of the photosignal level and the reset level of the floating drain. In a second mode of operation, simultaneous integration and readout processes are achieved through cessation of spill charges over the transfer gate. In a third mode of operation, regulation of the reset photodiode and transfer gate enables voltage gain between the photodiode and the sense node.

2 Claims, 8 Drawing Sheets

Flood PD (row n)

Spill PD/FD (row n)

Shutter closed
Start reading rows
Read row n FD

Flood PD (row n)

Spill PD/FD (row n)

Move on to row n+1

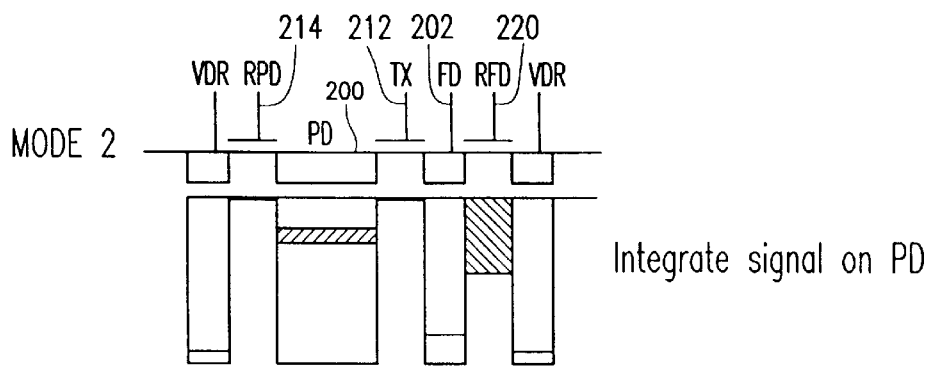
*FIG. 4A*  Integrate signal on PD
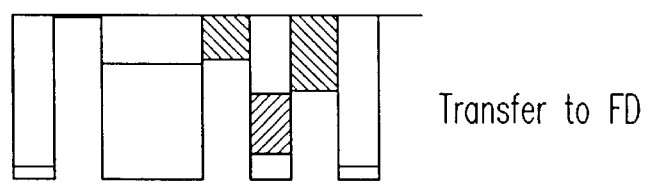
*FIG. 4B*  Transfer to FD
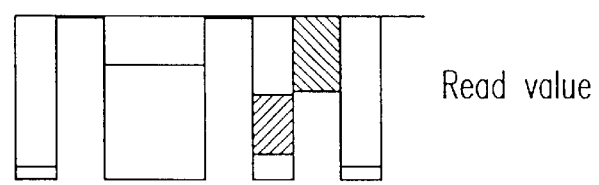
*FIG. 4C*  Read value
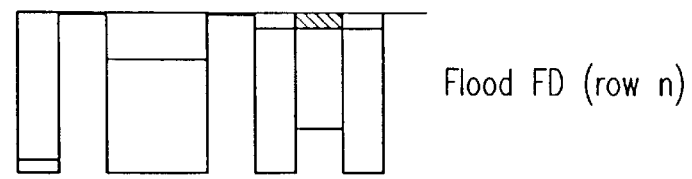
*FIG. 4D*  Flood FD (row n)

Spill FD (row n)

Shutter closed

Integrate signal on PD

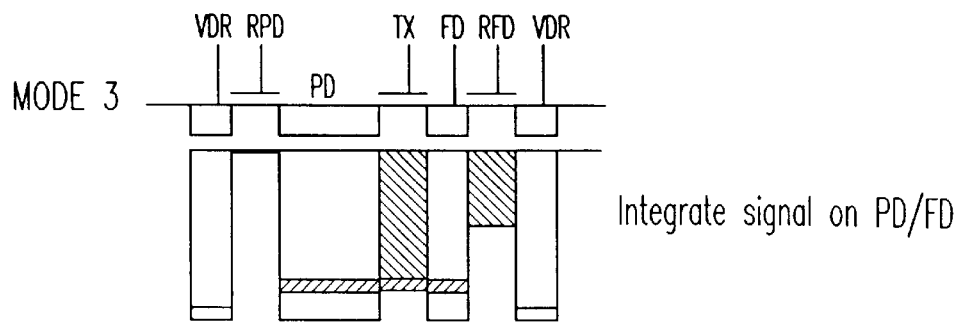
FIG. 5A — Integrate signal on PD/FD
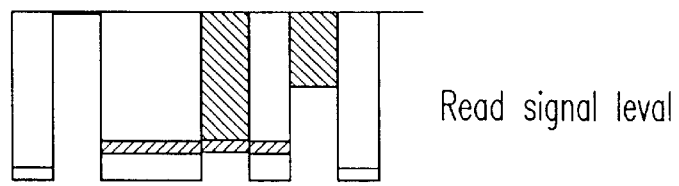
FIG. 5B — Read signal level
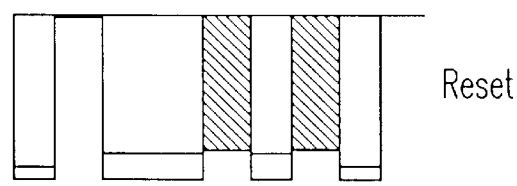
FIG. 5C — Reset
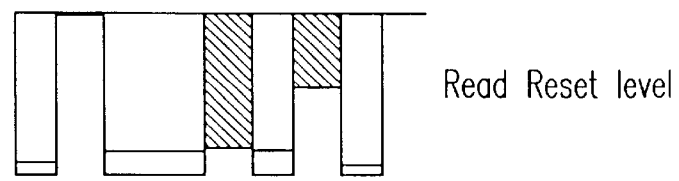
FIG. 5D — Read Reset level

PHOTODIODE-TYPE PIXEL FOR GLOBAL ELECTRONIC SHUTTER AND REDUCED LAG

TECHNICAL FIELD

This disclosure relates to active image capturing using photodiodes. More particularly, the present disclosure describes to active pixel devices using photodiodes as their active elements.

BACKGROUND

Active pixel devices include a light sensing element, and internal image processing structure. Many active pixel sensors, such as that described in U.S. Pat. No. 5,471,515, the disclosure of which is incorporated by reference herein, have a buffer structure, e.g., a source follower, as part of each pixel.

Active pixel sensors can use photodiodes or photogates, or other light sensitive elements. In many photodiode type active pixels, the light sensitive element is directly connected to the active pixel amplifier and/or buffer.

A global shutter effect commands all the pixels to integrate for the same short absolute period of time. This effectively freezes the motion of objects. However, in a photodiode device, an external light blocking shutter has typically been used to stop the photodiode from accumulating photosignal.

FIG. 1 shows one approach. A sampling switch 102 and capacitor 104 are used. Sampling switch 102 is placed between the photodiode 100 and the capacitor 104. The capacitor charge node 106 is connected to the active pixel amplifier 110. The photodiode voltage is sampled by a closing switch 102 and allowing the charge from the photodiode to charge sampling capacitor 104. Switch 102 and capacitor 104 are covered by a metallic light shield to avoid pickup of undesirable light signal. This allows freezing the charge output at any given time.

However, the charge from the photodiode 100 is shared onto the capacitor 104 in the voltage domain. When the switch 102 is closed, the charge flows from the photodiode 102 in order to equalize the voltage between photodiode output and capacitor 106 node. Thus, the maximum signal-induced voltage swing of the capacitor 104 may be limited by the voltage of the photodiode. Since charge is shared, the voltage swing is in fact, always lower. Furthermore, turning off the sampling switch may itself inject charge to the sampling capacitor. This, in turn, adds offset and noise.

SUMMARY

The present disclosure describes an approach to this drawback described above. This is done by enabling voltage gain between the photodiode 100 and its sensing node.

The embodiment reduces lag in a photodiode-type active pixel for a global electronic shutter. More particularly, the invention operates in three modes to achieve improved image quality and photodiode performance.

In the first mode of operation, an image is captured by a photodiode array. Lag is reduced when the photodiodes are globally reset by a flood and spill of charge cycle. A readout phase follows the reset phase. During this second phase, image quality is improved by the elimination of fixed pattern noise through the comparison of the photosignal level and the reset level of the floating drain.

In the second mode of operation, global shutter simultaneous integration and readout processes are achieved by cessation of charges which trickle out over the transfer gate as in the first mode.

In the third mode of operation, lower conversion gain of a combined photodiode is achieved by restoring the sensor to normal operation through regulation of the reset photodiode and the transfer gate.

The details of one or more embodiments of the invention are set forth in the accompanying drawings and the description below. Once the details of the invention are known, numerous additional innovations and changes will become obvious to one skilled in the art.

DESCRIPTION OF DRAWINGS

FIGS. 4A–4G are diagrams of a photosignal integration and readout phase operation for simultaneous integration and readout processes in accordance with the invention.

FIG. 5 is a diagram of a photosignal integration and readout phase operation for a combined photodiode with lower conversion gain in accordance with the invention.

Like reference numbers and designations in the various drawings indicate like elements.

DETAILED DESCRIPTION

Figure 1:
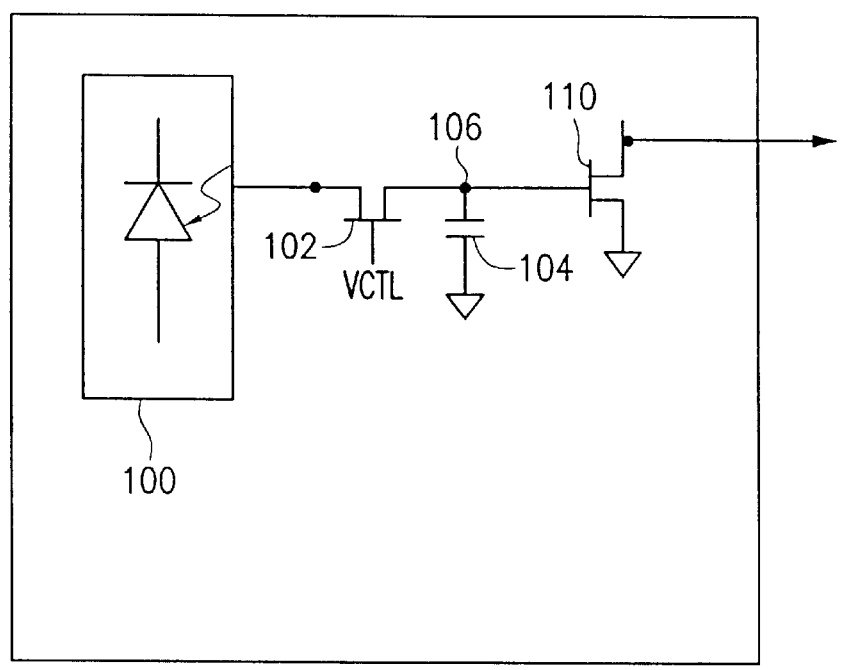
FIG. 1 is a diagram of an embodiment of a photodiode type active pixel.
Figure 2A:
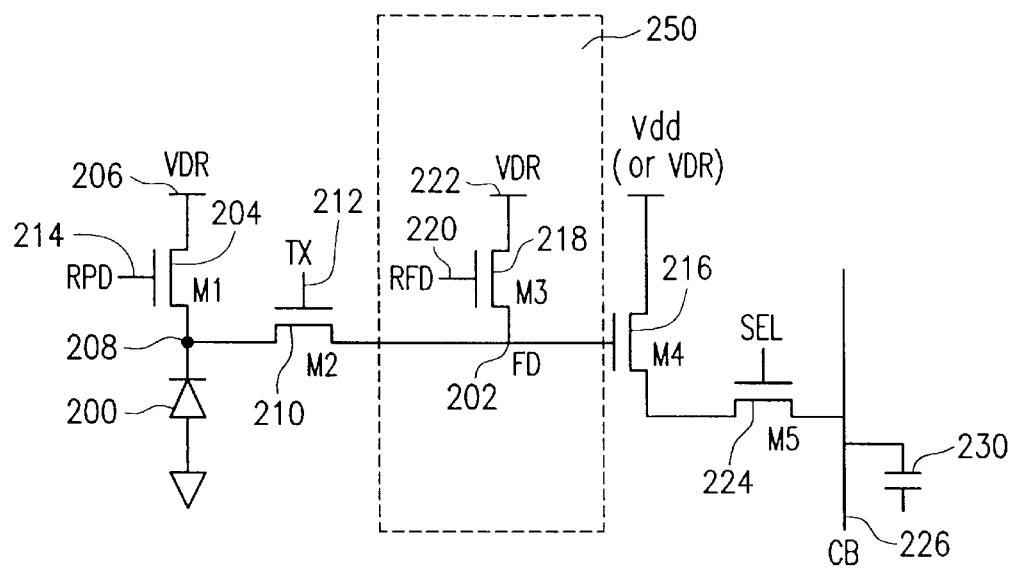
FIG. 2A is a diagram of a photodiode-type active pixel in accordance with the invention.
Figure 2B:
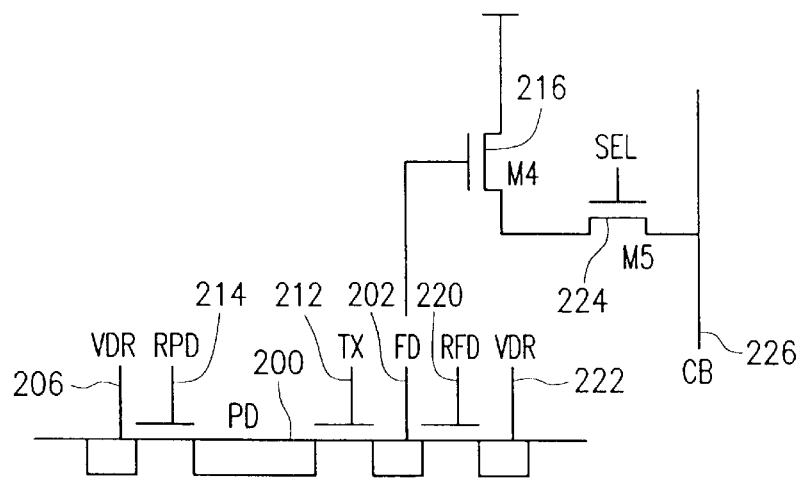
FIG. 2B is a detailed diagram of the photodiode-type active pixel in accordance with the invention.

An embodiment is shown in FIGS. 2A and 2B. This embodiment minimizes the problem of charge injection, and also reduces lag.

FIG. 2A shows a schematic view of the preferred circuit. Photodiode 200 is connected to the source of FET 204 whose drain is connected to a bias voltage level VDR 206. FET 204 is used to reset the photodiode. Signal RPD 214 controls reset of the photodiode.

FET 210 also connects the photodiode output node 208 to a floating diffusion ("FD") node 202. FD has a capacitance of approximately 0.016 pf (or 10 $\mu$V/e–). FET 210 is driven by a signal applied to transfer gate TX 212. Preferably, the FET is dc-biased in a 5 volt n-well implementation at about 1 volt.

FD 202 is connected to the gate of source-follower FET 216 which acts as a buffer and amplifier. The output is gated by selector transistor 224, and selectively driven to column bus 226.

The voltage on FD 202 is also reset under control of FET 218. FET 218 is driven by reset floating diffusion control voltage RFD 220. The reset transistor 218 resets the node to the level of voltage VDR 222.

FIG. 2B shows the same circuit in transistor well form. While FIG. 2A shows these devices as transistors, FIG. 2B shows them more accurately as gates and wells.

The operation of the image sensor in a first mode of operation is explained with reference to FIGS. 3A–3H, and the flowchart of FIG. 3I. This sensor operates in two phases—an image acquisition phase, and an image readout phase. This preferred mode of the sensor separates read out from integration in order to allow a simultaneously integrating electronic shutter and the dual sampling for fixed pattern noise reduction.

Figure 3A:
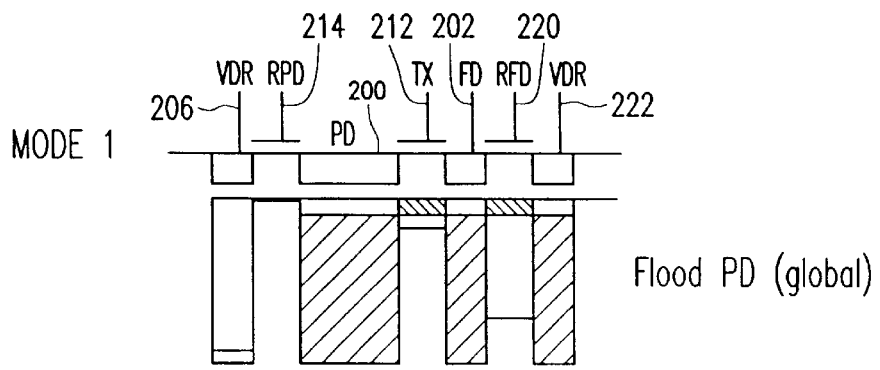
FIGS. 3A–3H are diagrams of a photosignal integration and readout phase operation in accordance with the invention.

The inventors recognized that lag is caused by an initial value in the photodiode at a beginning of integration. This embodiment starts with a global reset of the photodiodes at 300 and in the state shown in FIG. 3A. All photodiodes in the entire array are operated simultaneously. Voltage drain VDR 222 is initially set to 5 volts and RPD 214 is off. RFD 220 is turned on and VDR 206 is set to ground. This floods photodiode 200 and FD 202 with charge, as shown in FIG. 3A.

Figure 3B:
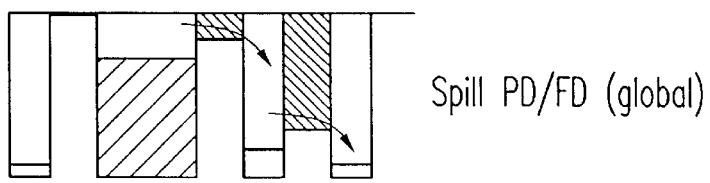

After approximately 1 $\mu$s, VDR 222 is returned to 5 volts as shown in FIG. 3B. This causes the flooded PD 200 to spill out over transfer gate TX 212 to the level set by the bias on 212. It also causes the charge on FD to spill over transistor 218's RFD barrier to VDR 222. This spill cycle also lasts approximately 1 $\mu$s.

The flood and spill ensures that the initial conditions on PD 200 will be the same for all frames and that its initial state is erased. Since all initial conditions are the same, artifacts, and hence lag, is eliminated or reduced.

Figure 3C:
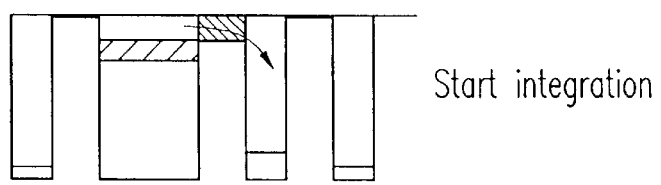
Figure 3D:
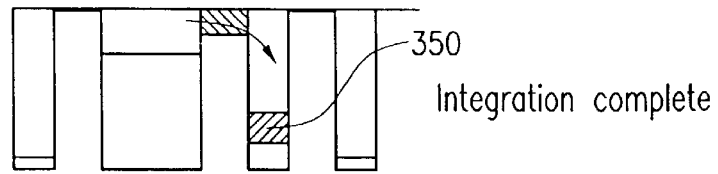
Figure 3E:
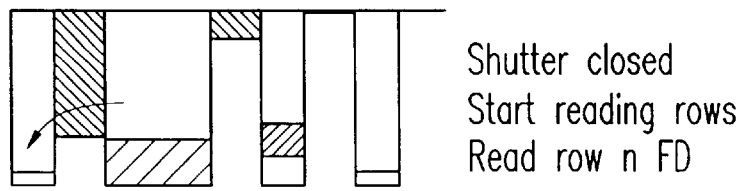
Figure 3F:
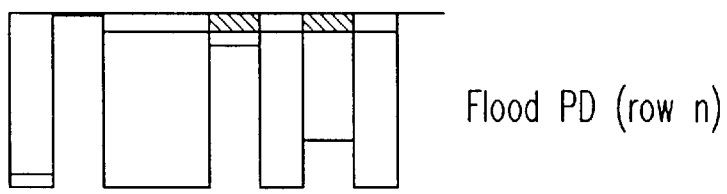
Figure 3G:
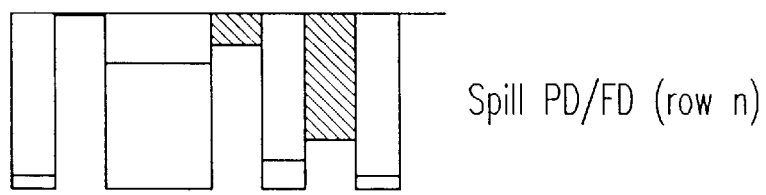
Figure 3H:
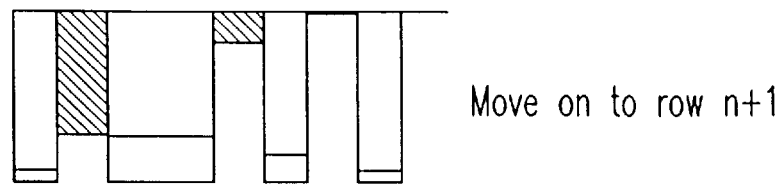
Figure 3I:
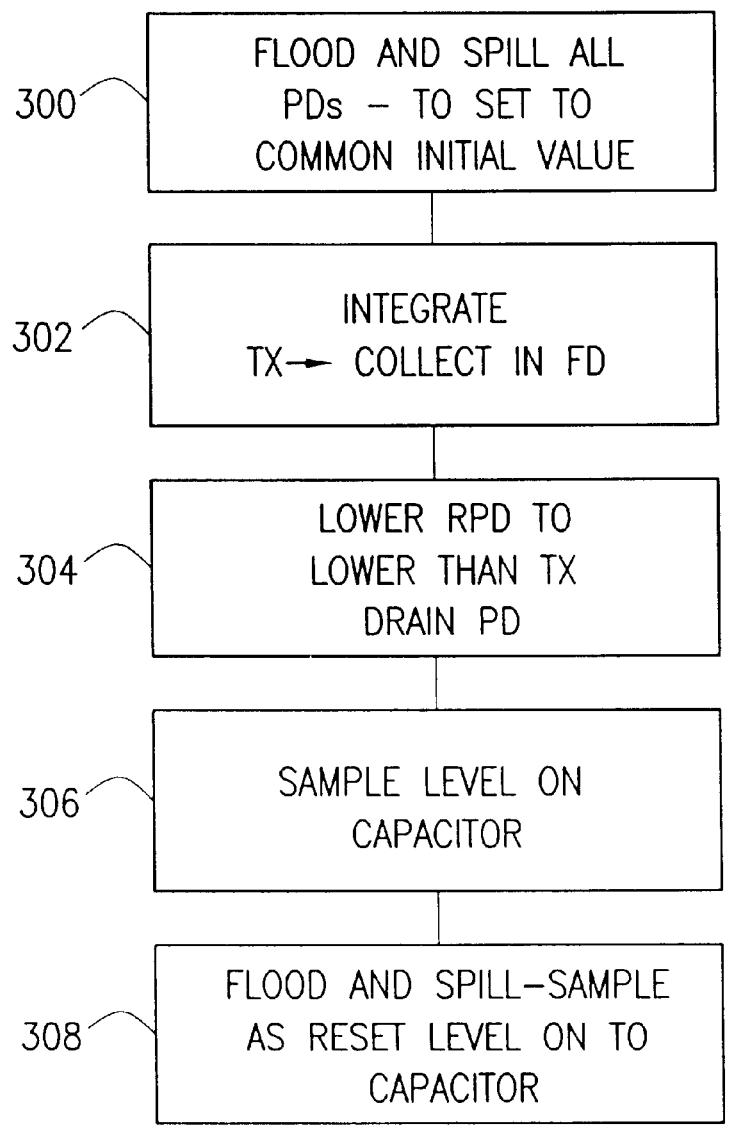
FIG. 3I is a diagram in flow chart form showing operation of a photodiode type active pixel according to one aspect of the invention.

After the reset, PD 200 integrate the photosignal for the desired integration period, as step 302 in FIG. 3I, and as shown in FIG. 3C. The initial flood and spill has left the PD charged to the level of the TX barrier. Hence, as the photosignal is collected, it trickles over TX 212 barrier and is collected by FD 202 as collected charge 350.

The change in voltage on node FD 202 is determined by its capacitance and is estimated above to be 10 $\mu$V/e–.

The integration period is ended by setting RPD 214 to 5 volts, as shown in FIG. 3E. This effectively closes the shutter by draining all additional photoelectrons from PD down to the level of the RPD, over the transistor 210 barrier to the drain level VDR 206. The barrier RPD is kept lower than TX 212 to ensure that the photoelectrons are drained way and not into the FD, as shown in step 304. Hence, the photosignal is held on FD 202. FD 202 is covered by a light shield 250 and protected from unwanted light signal. The output of the floating diffusion drives the high impedance input of a source follower transistor 216. The signal is hence stored as long as RPD 214 remains on. This continues until after the pixel is selected for readout.

In the readout phase, pixels are selected a row at a time by the select transistor 224. When enabled, the voltage on the output of the source follower transistor 216 is driven onto the column output bus CB 226. When the row is first selected, the voltage is sampled onto capacitor 230 at 306. This represents the photosignal level (VS). Photodiode 200 and output node FD 202 is then reset by another flood and spill sequence as above, and shown in 3F and 3G. The cycle is timed identically to the global reset described above. At the completion of the cycle, RFD 220 is set low and FD 202 is sampled. This represents the reset level (VR) of the floating drain FDR. That voltage is sampled on to capacitor 230 to form a difference between VS and VR which is proportional to the integrated light signal during the integration period. By taking the difference, fixed pattern noise introduced by transistor threshold non-uniformities and possibly timing skew across rows is minimized, therebyimproving image quality. After subsequent processing (e.g., analog and digital conversion and readout), the next row is selected for readout, as shown in FIG. 3H.

FIG. 3I is a flow diagram showing operation of an embodiment of the invention according to the above-described process. The illustrated process steps include "Flood and spill all photodiodes to set to a common initial value" 300, "Integrate, TX and collect in FD" 302, Lower RPD to lower than TX drain PD" 304, "Sample level on capacitor" 306 and "Flood and spill — sample as reset level on to capacitor" 308.

This process repeats until all rows desired for readout have been read out. The sensor then returns to its integrate mode.

Because charge is transferred in a trickle mode between the PD 200 and FD 202, operations affecting either node during integration and prior to readout may adversely affect the accuracy.

Figure 4E:
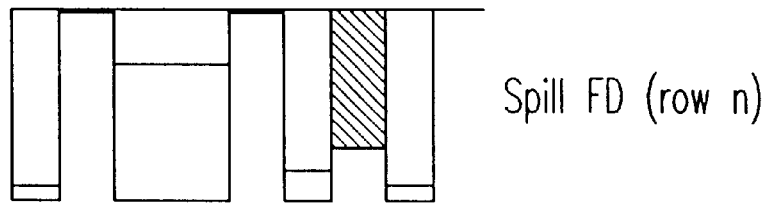

An alternative mode 2 is illustrated in FIGS. 4A–4E. In mode 2, charge is not continuously trickled over the TX 212 barrier. After the flood and spill cycle of FIGS. 3A and 3B, TX 212 is set low (to ground)as shown in FIG. 4A. This causes the photodiode to integrate the incoming charge. Charge can then be transferred to FD 202 all at once, at a desired time. TX 212 is returned to its initial spill value. This transfers the excess charge obtained since the spill of FIG. 3b from PD 200 is to FD 202. FD 202 can then be read out as shown in FIG. 4C. The reset level of FD is estimated by performing the flood and spill operation with TX 212 set low, as shown, respectively, in FIGS. 4D and 4E. This allows simultaneous integration and readout processes.

Figure 4F:
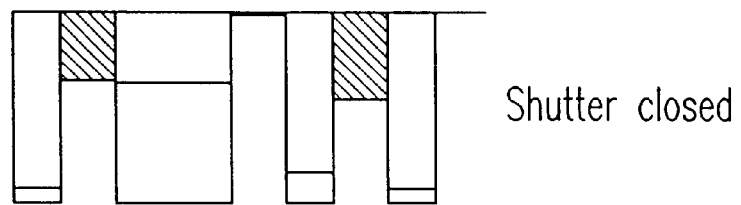
Figure 4G:
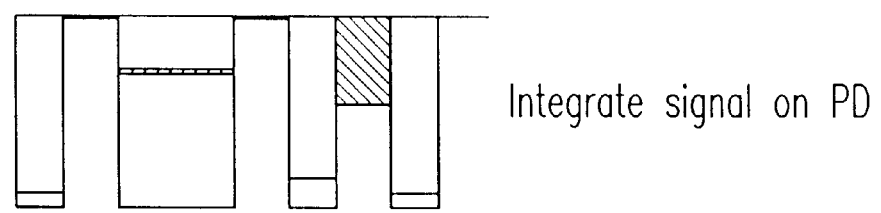

FIGS. 4F and 4G show how the shutter can be closed by enabling RPD to allow incoming charge to spill over the barrier.

This mode does not describe PD 200 being flooded between frames. RPD 214 can still be used to control the integration duty cycle, with transfer to FR 202 only during the inter-frame planking interval. However, since the threshold voltages of RPD 214 and RFD 220 may not be equal, some offset nonuniformity can be expected.

If RPD 214 is a little deeper than RFD 220 for the same applied gate voltage, PD 200 will have a "pocket" that will result in reduced signal for low light levels.

Operation of the image sensor in mode 3 is illustrated in FIG. 5. This is a diagram of a photosignal integration and readout phase for a combined photodiode with lower conversion gain in accordance with the invention.

The sensor can be restored to "normal" photodiode APS operation by keeping RPD 214 off. TX 212 is biased at Vdd. This creates a combined photodiode of PD 200 and FD 202. FIG. 5A shows integrating the incoming signal on the combined PD/FD. The signal is read by sampling the source follower 216 in FIG. 5B. The PD/FD combination is then reset in FIG. 5C by turning on RFD and hence draining the PD/FD combination. At FIG. 5D, that reset level is read for correction of the reset level.

Other embodiments are contemplated. For example, different switching elements could be used. Different channel conductivities allows the biasing to be done differently. All such modifications are intended to be encompassed within the following claims.

What is claimed is:

1. A method, comprising:
   initially, resetting a plurality of photodiodes in image sensing array, by initially flooding each of said photodiodes with charge, and then allowing each of said photodiodes to spill to a common initial value;

after said resetting, integrating for the desired integration, in each of said photodiodes, and allowing charge to trickle continuously into a collection node during said integrating;

after said integrating, sampling a signal level by determining a level of charge on said collection node;

again filling and spilling said plurality of photodiodes in said image sensing array, after said sampling;

second sampling a level of said photodiodes as a reset level; and taking a difference between said signal level and said reset level as an output value from each pixel.

2. A method as in claim 1, wherein said first sampling and said second sampling are carried out by transferring a voltage on to a capacitor.

* * * * *